United States Patent
Smith et al.

(10) Patent No.: US 10,559,490 B1
(45) Date of Patent: Feb. 11, 2020

(54) DUAL-DEPTH STI CAVITY EXTENSION AND METHOD OF PRODUCTION THEREOF

(71) Applicant: GLOBALFOUNDRIES Inc., Grand Cayman (KY)

(72) Inventors: Elliot John Smith, Santa Barbara, CA (US); Nigel Chan, Dresden (DE); Ming-Cheng Chang, Dresden (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/107,563

(22) Filed: Aug. 21, 2018

(51) Int. Cl.
*H01L 21/762* (2006.01)
*H01L 29/06* (2006.01)
*H01L 21/306* (2006.01)

(52) U.S. Cl.
CPC .. *H01L 21/76232* (2013.01); *H01L 21/30608* (2013.01); *H01L 29/0653* (2013.01)

(58) Field of Classification Search
None
See application file for complete search history.

(56) References Cited

U.S. PATENT DOCUMENTS

| | | | |
|---|---|---|---|
| 6,313,008 B1 * | 11/2001 | Leung | H01L 21/76232 257/510 |
| 7,622,778 B2 | 11/2009 | Lee et al. | |
| 9,076,868 B1 | 7/2015 | Tsai et al. | |
| 2009/0072355 A1 | 3/2009 | Cheng et al. | |
| 2012/0292700 A1 * | 11/2012 | Khakifirooz | H01L 21/84 257/347 |
| 2015/0076555 A1 * | 3/2015 | Yang | H01L 21/76229 257/141 |
| 2016/0181261 A1 * | 6/2016 | Wu | H01L 27/11521 257/316 |

OTHER PUBLICATIONS

Oh et al. "High-Density Low-Power-Operating DRAM Device Adopting 6F2 Cell Scheme with Novel S-RCAT Structure on 80nm Feature Size and Beyond", published in Proc. ESSDERC, Grenoble, France, 2005, pp. 117-180.
Grenouillet et al., "UTBB FDSOI transistors with dual STI for a multi-Vt strategy at 20nm node and below", published in IEEE 2012, 4 pages.
Sui et al., "A Study of Sigma-shaped Silicon Trench Formation", Published in ECS Transactions 52(1):331-335—Mar. 2013, pp. 331-335.

* cited by examiner

*Primary Examiner* — Michelle Mandala
(74) *Attorney, Agent, or Firm* — Ditthavong & Steiner, P.C.

(57) ABSTRACT

A device including multiple depth STI regions with sidewall profiles, and method of production thereof Embodiments include a top region having a substantially vertical sidewall profile; and a bottom region having a width greater than or equal to the top region and a sidewall profile.

15 Claims, 22 Drawing Sheets

US 10,559,490 B1

DUAL-DEPTH STI CAVITY EXTENSION AND METHOD OF PRODUCTION THEREOF

TECHNICAL FIELD

The present disclosure relates to semiconductor devices, including integrated circuits (ICs). The present disclosure is particularly applicable to shallow trench isolation (STI) structures and methods of fabrication.

BACKGROUND

As ICs continue to decrease in size in pursuit of higher device density and production efficiency, the aspect ratios of topographical features, e.g., STI, in small regions, e.g., static random access memory (SRAM) cells, are restricted, e.g., widening the STI has a large impact on the layout area and depth of the STI is limited by the aspect ratio and process complexity. A combination of both a shallow and deep isolation is required to enable increased flexibility in the well bias but poses the challenge that the deep isolation must fully electrically isolate two adjacent well regions.

A need, therefore, exists for devices with extended STI depth with a reduced critical dimension (CD) with reduced leakage, and for enabling methodology.

SUMMARY

An aspect of the present disclosure is a device including multiple depth STI regions having a similar or a different sidewall profiles for top and bottom regions.

Another aspect of the present disclosure is a method of forming multiple depth STI regions having a similar or a different sidewall profiles for top and bottom regions.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a device including a multiple depth STI regions, wherein each of the multiple depth STI regions further includes: a top region having a substantially vertical sidewall profile; and a bottom region having a width greater than or equal to the top region and a sidewall profile.

Another aspect of the present disclosure is a method of forming a multiple depth STI regions including: forming a top region having a substantially vertical sidewall profile; and forming a bottom region having a width greater than or equal to the top region and a sidewall profile.

A further aspect of the present disclosure is a device including a multiple depth STI regions, wherein each of the multiple depth STI regions further includes: a first well in a portion of a substrate, the first well electrically isolated from the substrate; a second well in a portion of the first well, the second well electrically isolated from the first well and the substrate; a silicon-on-insulator (SOI) layer over a buried oxide (BOX) layer above the second well; and the multiple depth STI regions, laterally separated, through the SOI layer and the BOX layer and in the substrate, wherein the multiple depth STI regions includes a top region having a substantially vertical sidewall profile and a bottom region having a width greater than or equal to the top region and a sidewall profile.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of well to well leakage attendant upon forming a shallow STI. The problem is solved, inter alia, by forming a self-aligned cavity extension at bottom regions of multiple depth STI regions to extend the isolation.

Methodology in accordance with embodiments of the present disclosure includes a multiple depth STI regions, wherein each of the multiple depth STI regions further includes a top region having a substantially vertical sidewall profile, and a bottom region having a width greater than or equal to the top region and a sidewall profile.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
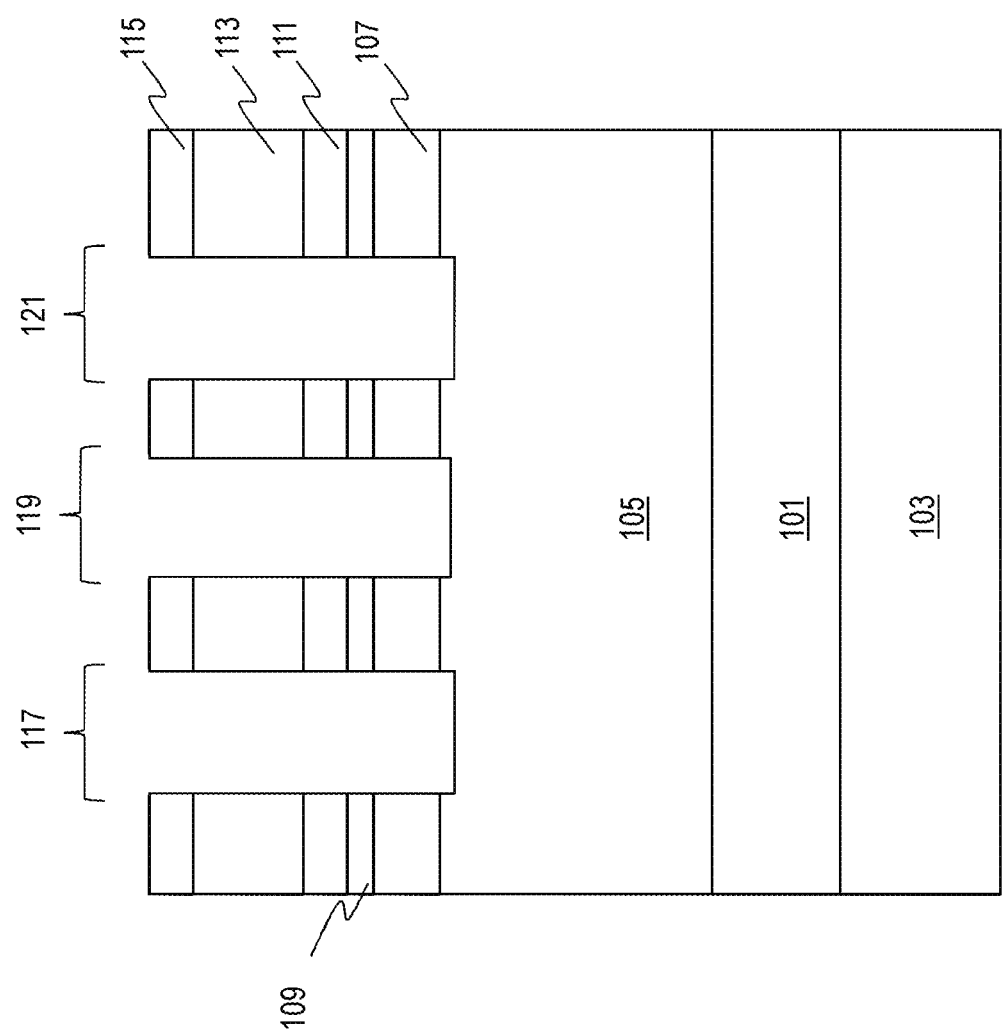
FIGS. 1 through 4 schematically illustrate cross-sectional views of a process flow for forming a top region of multiple depth STI regions, in accordance with an exemplary embodiment.

FIGS. 1 through 4 schematically illustrate cross-sectional views of a process flow for forming a top region of multiple depth STI regions, in accordance with an exemplary embodiment. Referring to FIG. 1, a first well 101, e.g., an N-type well, is formed, e.g., by ion implantation or other well-known technology, in a portion of a substrate 103, e.g., a p-type substrate. In this instance, the first well 101 is electrically isolated from the substrate. Then, a second well 105, e.g., a P-type well, is formed, e.g., by ion implantation or other well-known technology, in a portion of the first well 101. In this instance, the second well 105 is electrically isolated from the first well 101 and the substrate 103. Thereafter, a BOX layer 107 having a thickness, e.g., of 5 nm to 50 nm, and an SOI layer 109 having a thickness, e.g., of 5 nm to 10 nm, is provided over the second well 105, respectively. In one instance, a channel silicon germanium (cSiGe) is epitaxially grown in a portion of the SOI layer 109. Subsequently, an oxide layer 111 is formed, e.g., of thermal oxide or conditional oxide, to a thickness, e.g., of 5 nm to 20 nm, over the SOI layer 109. Then, a pad nitride layer 113 is formed, e.g., to a thickness of 35 nm to 40 nm, over the oxide layer 111. Thereafter, an undoped silicon oxide (UDOX) layer 115 is formed, e.g., to a thickness of 20 nm to 40 nm, over the pad nitride layer 113. Next, a plurality of STI 117, 119 and 121 are formed, e.g., by an anisotropic etching, having a width, e.g., of 10 nm to 200 nm, through the UDOX layer 115, the pad nitride layer 113, the oxide layer 111, the SOI layer 109 and the BOX layer 107 to the second well 105. In one instance, the cSiGe is epitaxially grown in the SOI layer 109 adjacent to the STI 119.

Figure 2:
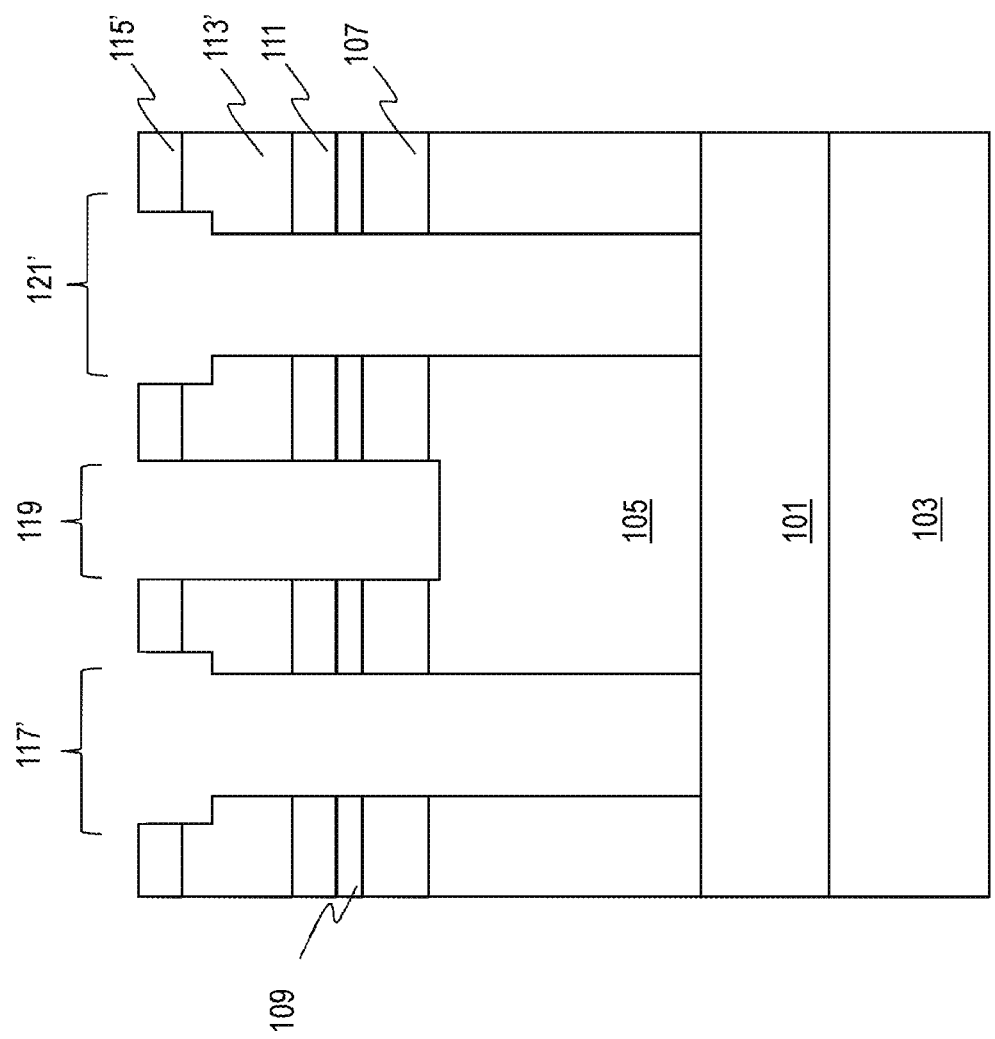
Figure 3:
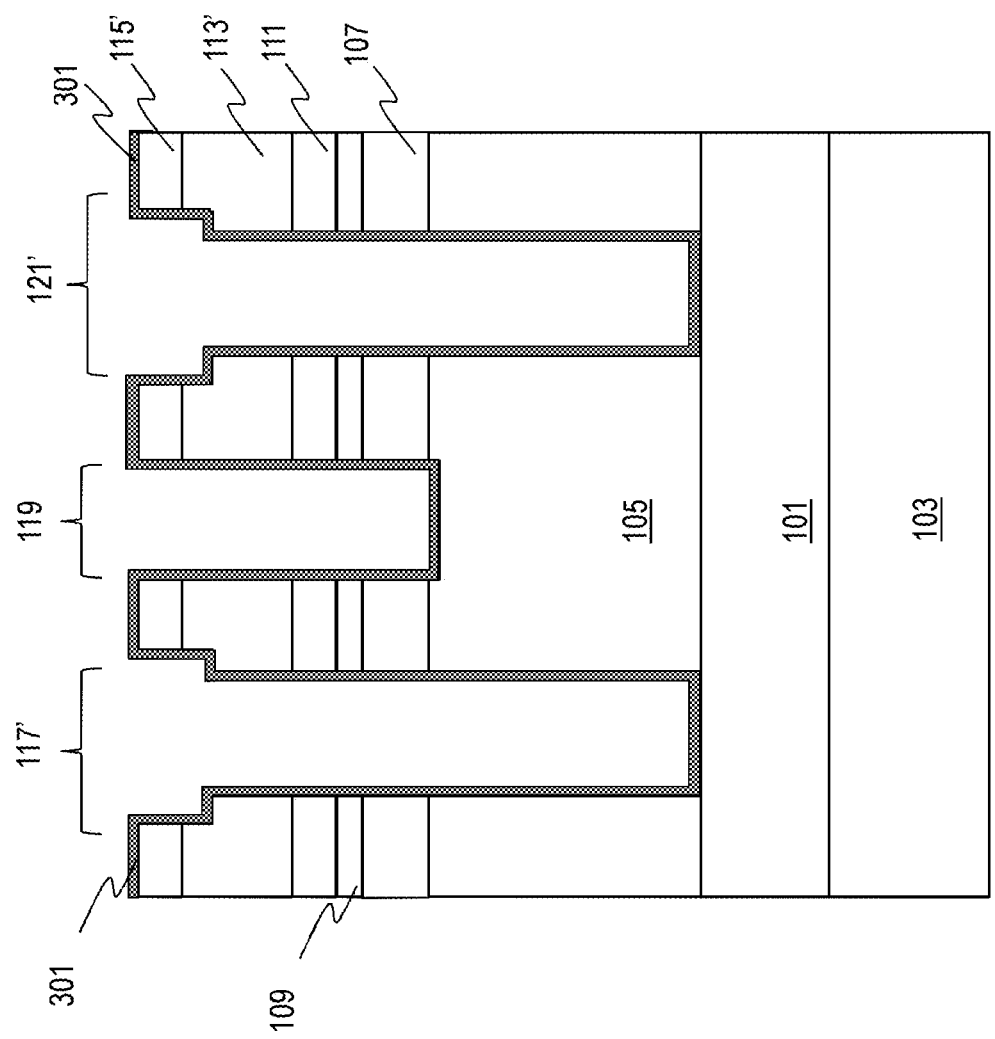
Figure 4:
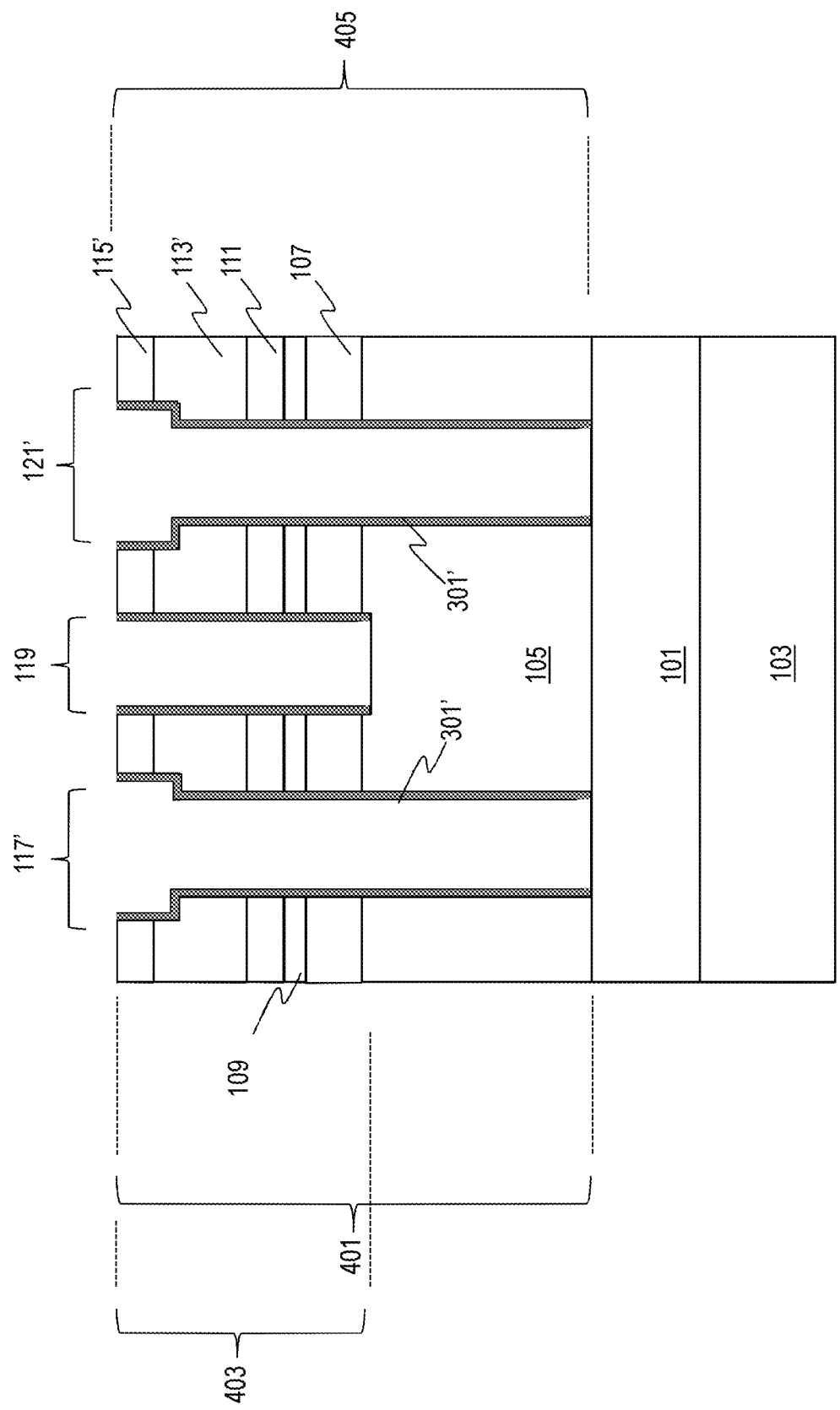

As depicted in FIG. 2, the STI 117 and 121 are vertically expanded through the second well 105 to the first well 101, e.g., by a deep fence formation process that is anisotropic, thereby forming STI 117' and 121'. In addition, the deep fence formation process during the vertical expansion of the STI 117 and 121 also removes portions of the UDOX layer 115 and the pad nitride layer 113, thereby forming UDOX layer 115' and pad nitride layer 113'. In one instance, the deep fence formation process includes reactive-ion etching (RIE), dry etching or any other similar etching processes. Then, a silicon nitride (SiN) liner 301 is formed, e.g., by chemical vapor deposition (CVD) or atomic layer deposition (ALD), to a thickness, e.g., of 2 nm to 10 nm, over the UDOX layer 115' and the STI 117', 119, and 121', as represented in FIG. 3. Thereafter in FIG. 4, portions of the SiN liner 301 over the UDOX layer 115' and bottom surfaces of the STI 117', 119, and 121' are removed, e.g., by a deep fence spacer etching, forming SiN liner 301' and top regions 401, 403 and 405, respectively.

Figure 5:
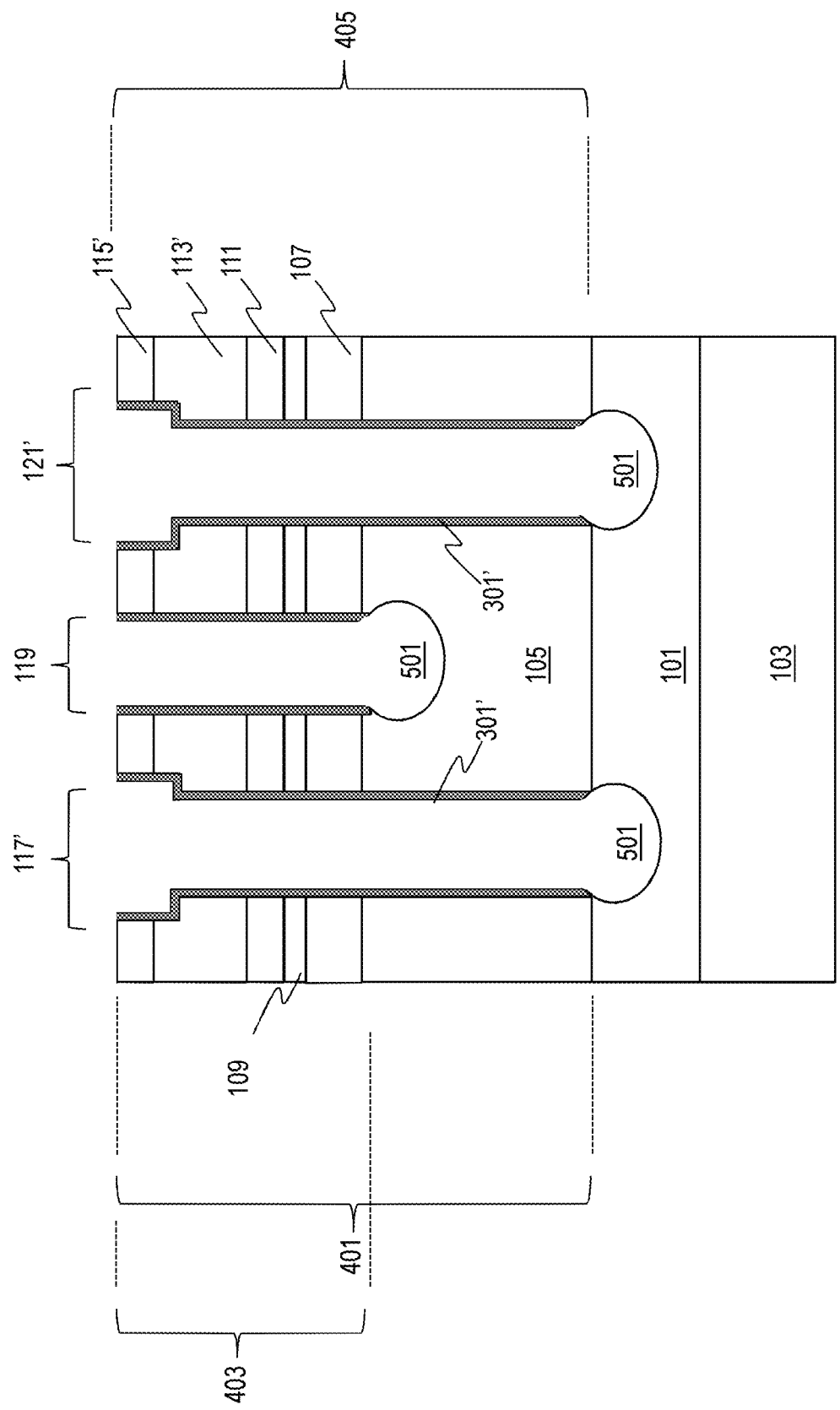
FIGS. 5 through 10 schematically illustrate cross-sectional views of a process flow for forming a bottom region of the multiple depth STI regions having a circular-shaped sidewall profile, in accordance with an exemplary embodiment.
Figure 6:
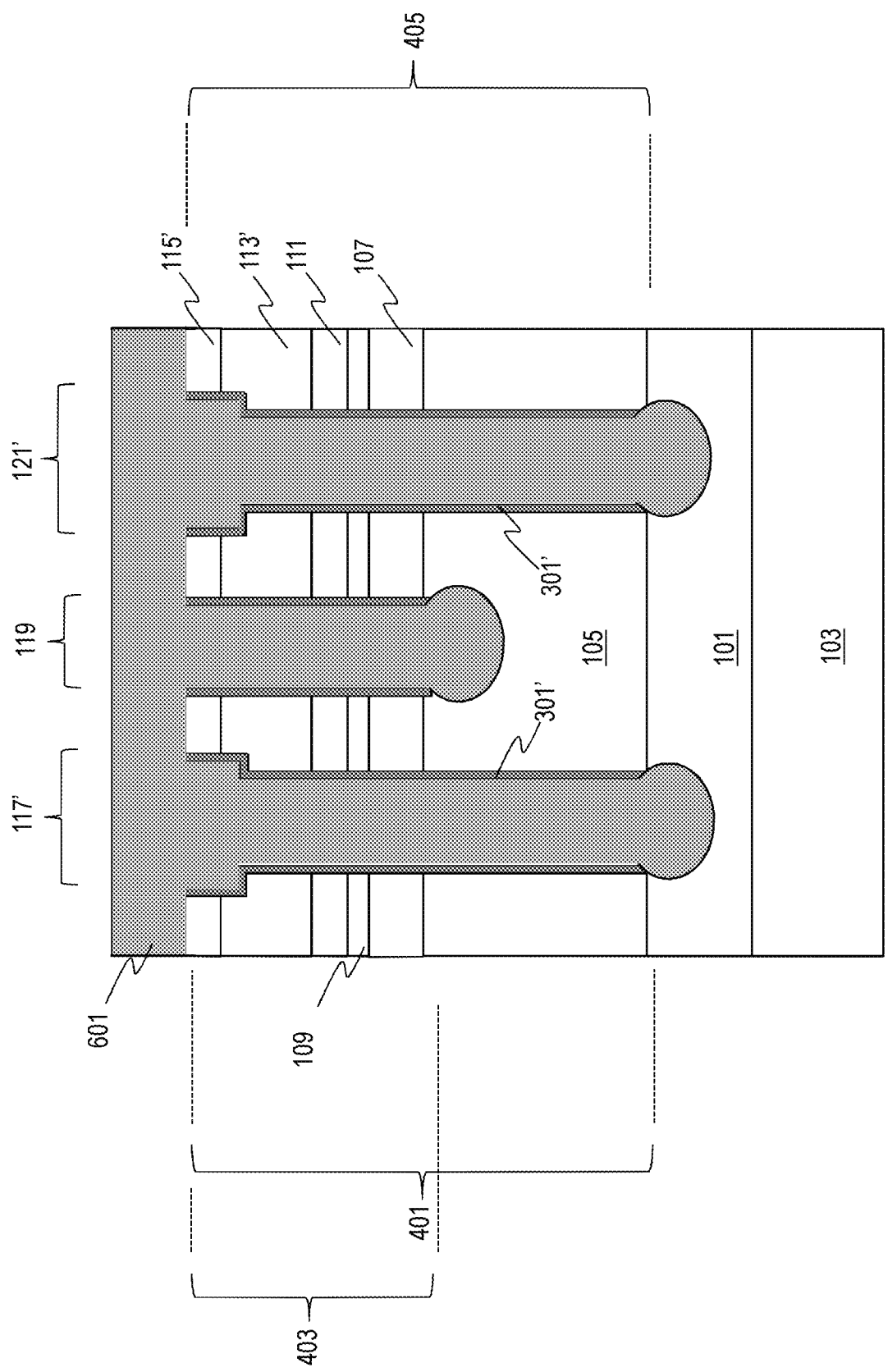
Figure 7:
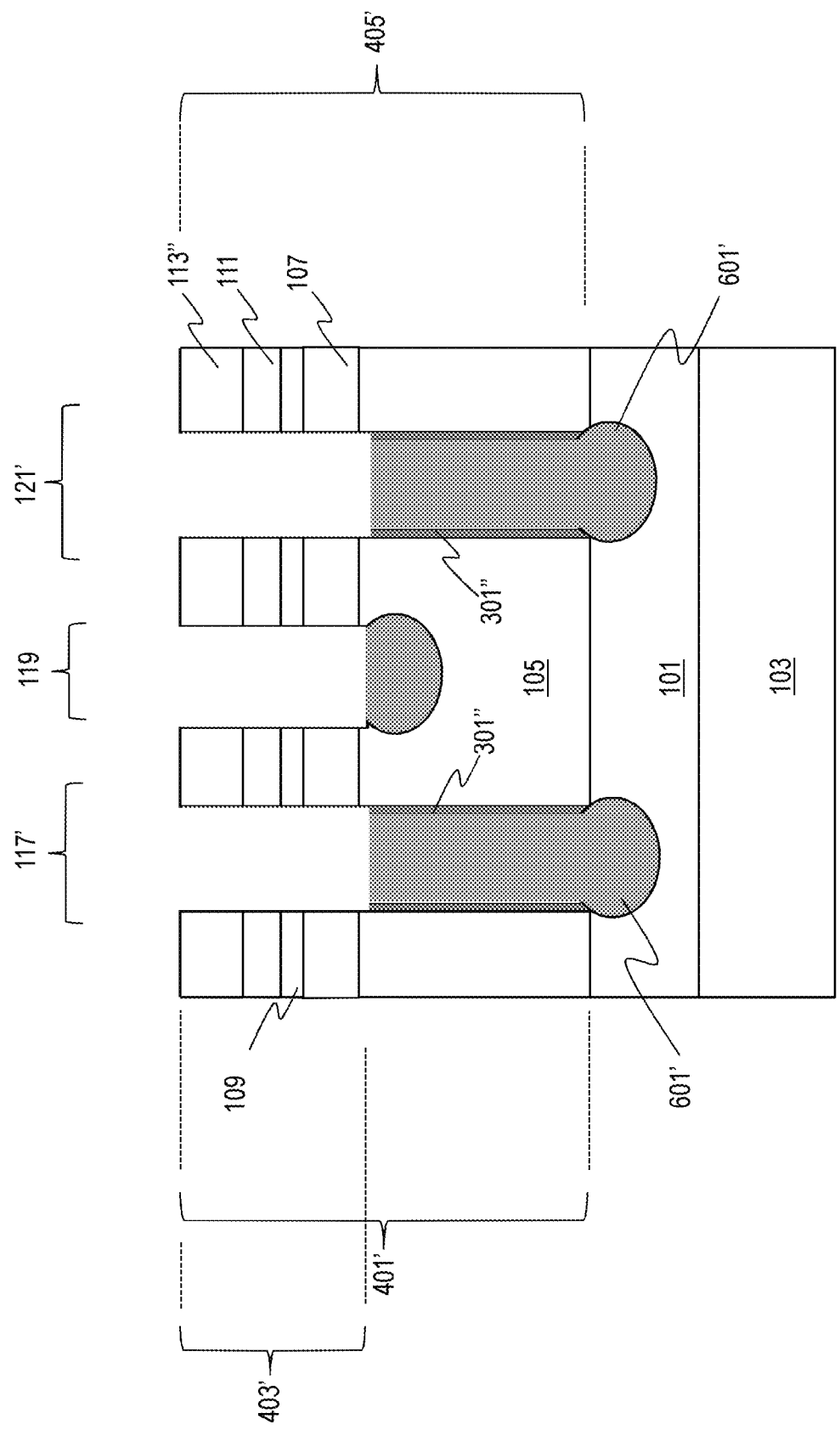

FIGS. 5 through 10 schematically illustrate cross-sectional views of a process flow for forming a bottom region of the multiple depth STI regions having a circular-shaped sidewall profile, in accordance with an exemplary embodiment. Referring to FIG. 5, bottom region 501 of the STI 117', 119, and 121' are formed, e.g., by an isotropic ball wet etching or any other similar etching processes, having a circular-shaped sidewall profile and a width greater than or equal to the top regions 401, 403 and 405. In this instance, the bottom region 501 has a diameter, e.g., of 5 nm to 100 nm. In another instance, the bottom region 501 may have any other shapes based on the etching. Thereafter, an oxide layer 601 is conformally formed, e.g., by flowable chemical vapor deposition (FCVD) or any other similar deposition processes, over the UDOX layer 115' and the STI 117', 119, and 121', as depicted in FIG. 6. Next, in FIG. 7, the oxide layer 601 is polished, e.g., by a conventional polishing process. Then, the UDOX layer 115' and portions of the pad nitride layer 113', SiN liner 301' and the oxide layer 601 are removed, e.g., by an oxide pullback process or any other similar pullback processes, thereby forming pad nitride layer 113", SiN liner 301", oxide layer 601' and top regions 401', 403' and 405'. In this instance, the upper surface of the SiN liner 301" and oxide layer 601' is below the upper surface of the second well 105.

Figure 8:
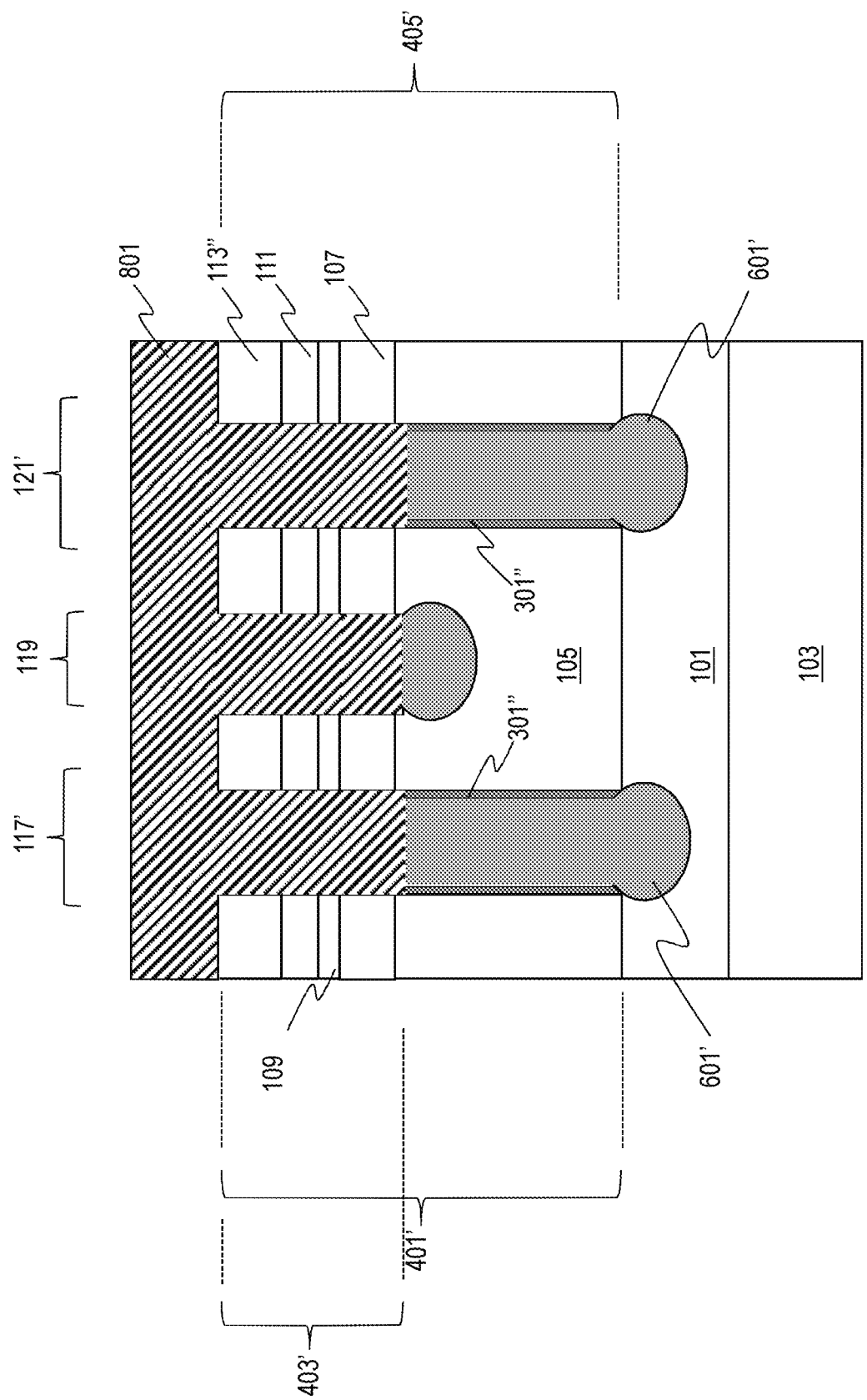
Figure 9:
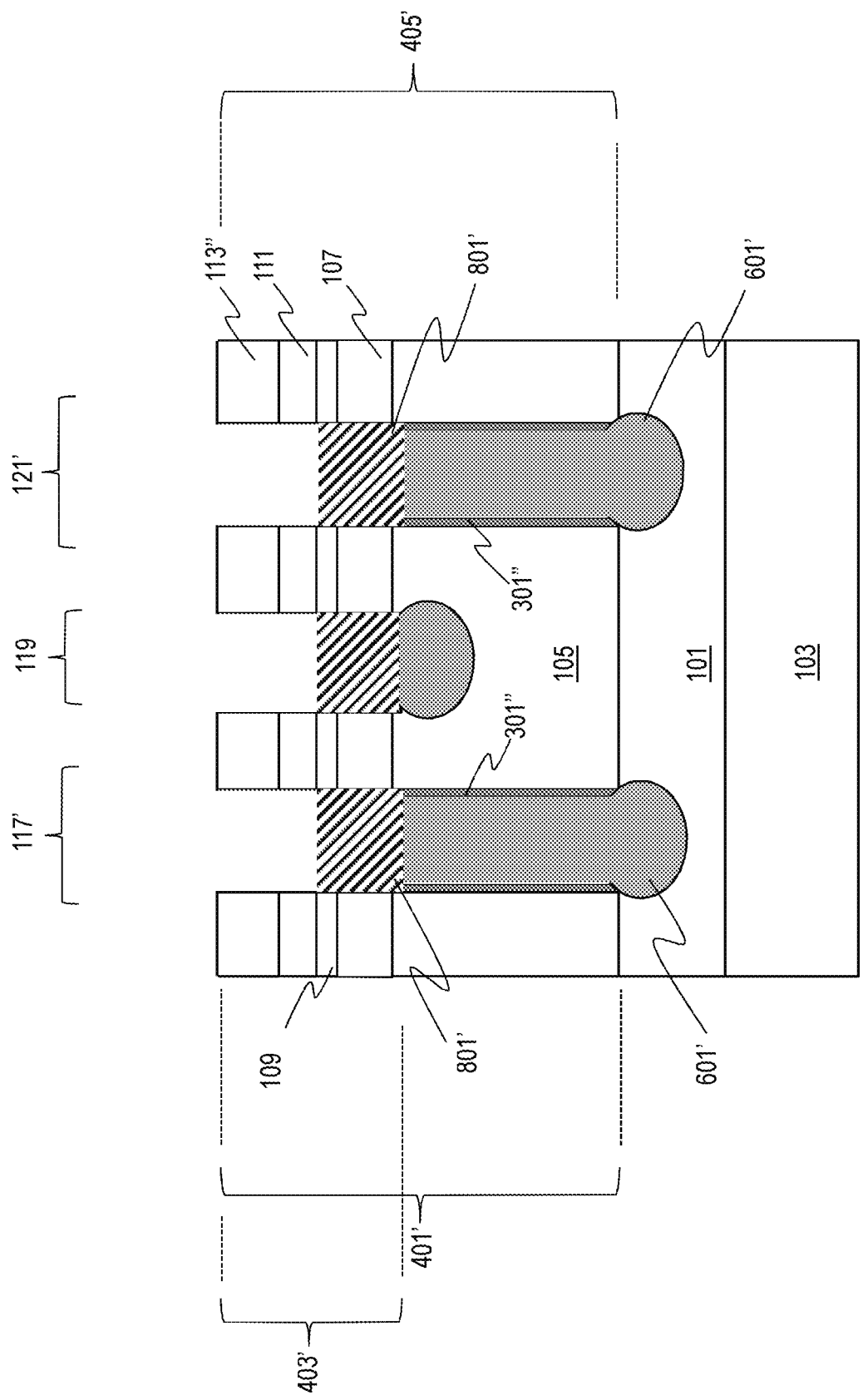
Figure 10:
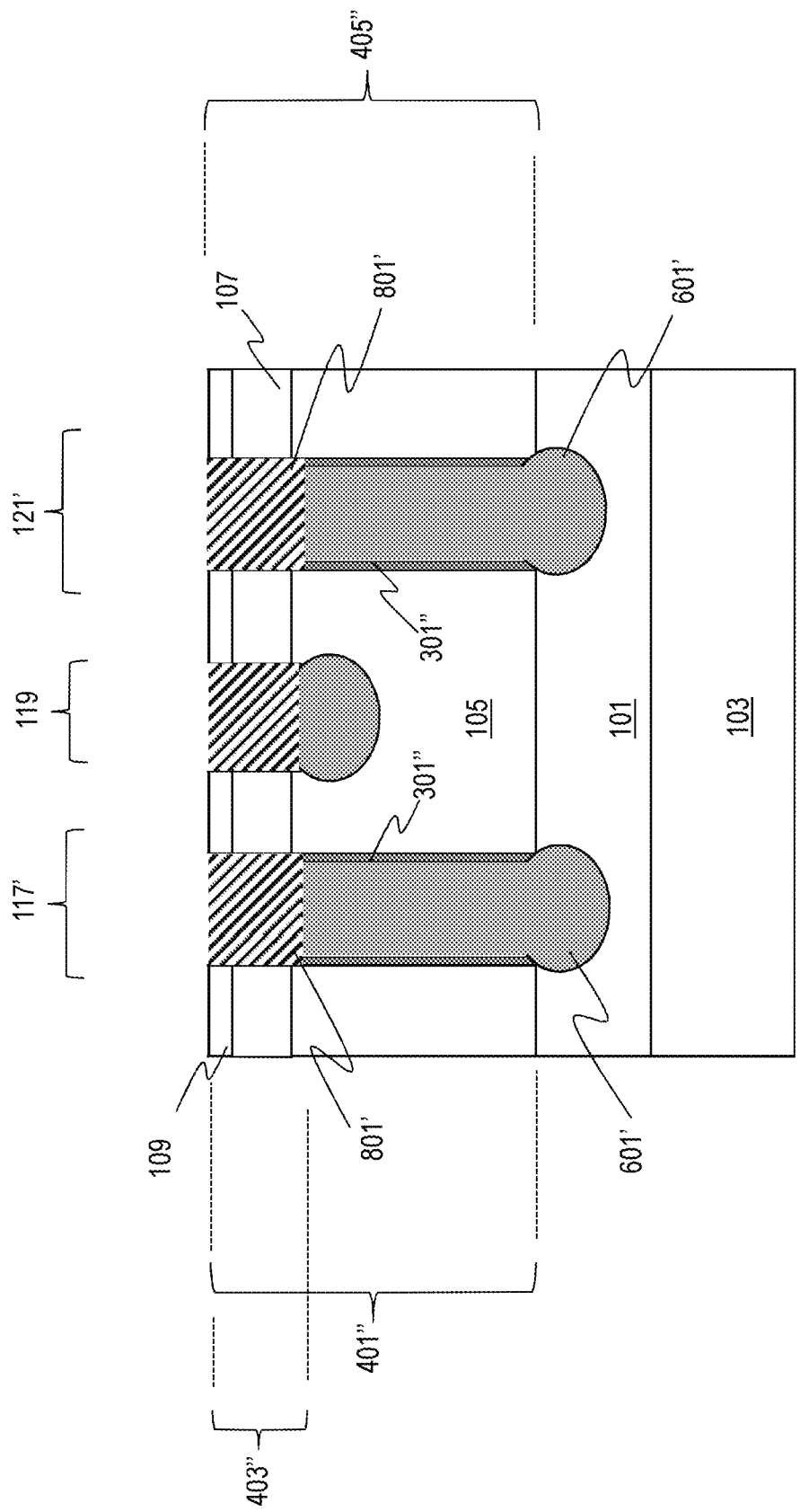

As illustrated in FIG. 8, an HDP or TEOS layer 801 is conformally formed over the pad nitride layer 113" and the exposed portion of the STI 117', 119 and 121'. Then, the HDP or TEOS layer 801 is polished, e.g., by a conventional polishing process. Subsequently, a portion of the HDP or TEOS layer 801 is removed, e.g., by an etch-back process or any other similar processes, forming HDP or TEOS layer 801', as shown in FIG. 9. In this instance, the upper surface of the HDP or TEOS layer 801' is substantially coplanar to the upper surface of the SOI layer 109. Thereafter, the pad nitride layer 113" and the oxide layer 111 are removed, e.g., by a stripping process, thereby forming top regions 401", 403" and 405", as represented in FIG. 10.

Figure 11:
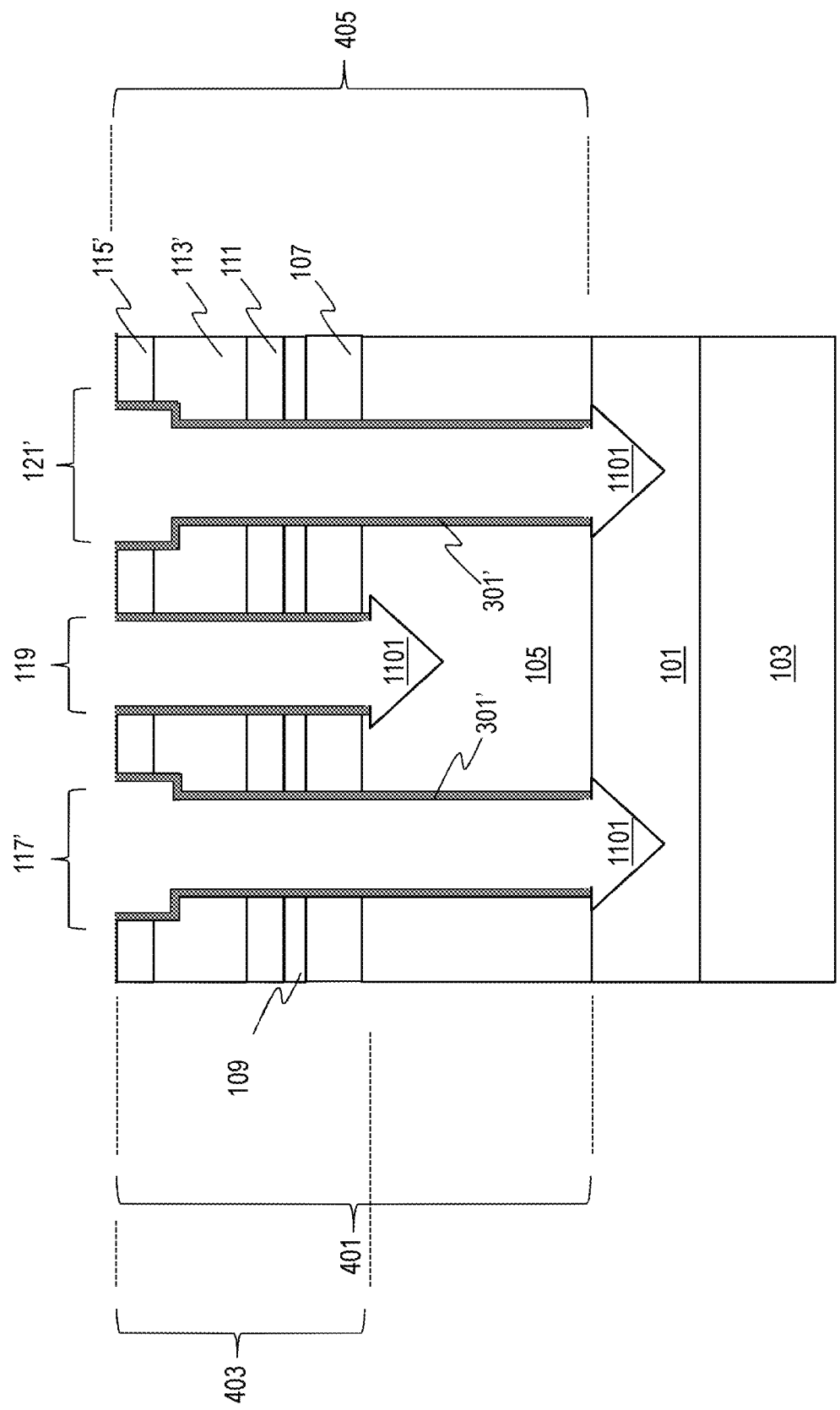
FIGS. 11 through 16 schematically illustrate cross-sectional views of a process flow for forming a bottom region of the multiple depth STI regions having a triangular-shaped sidewall profile, in accordance with an exemplary embodiment.
Figure 12:
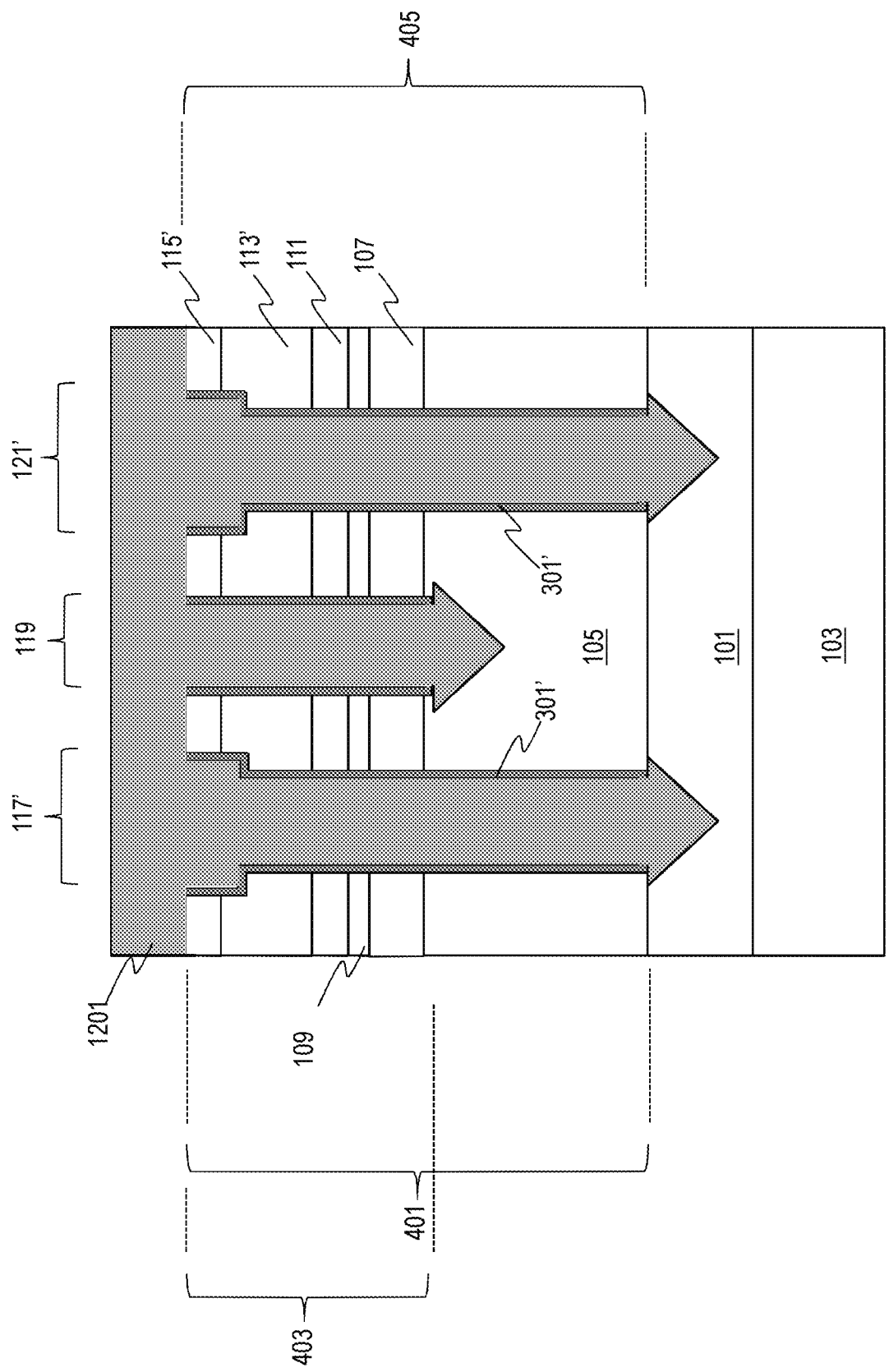
Figure 13:
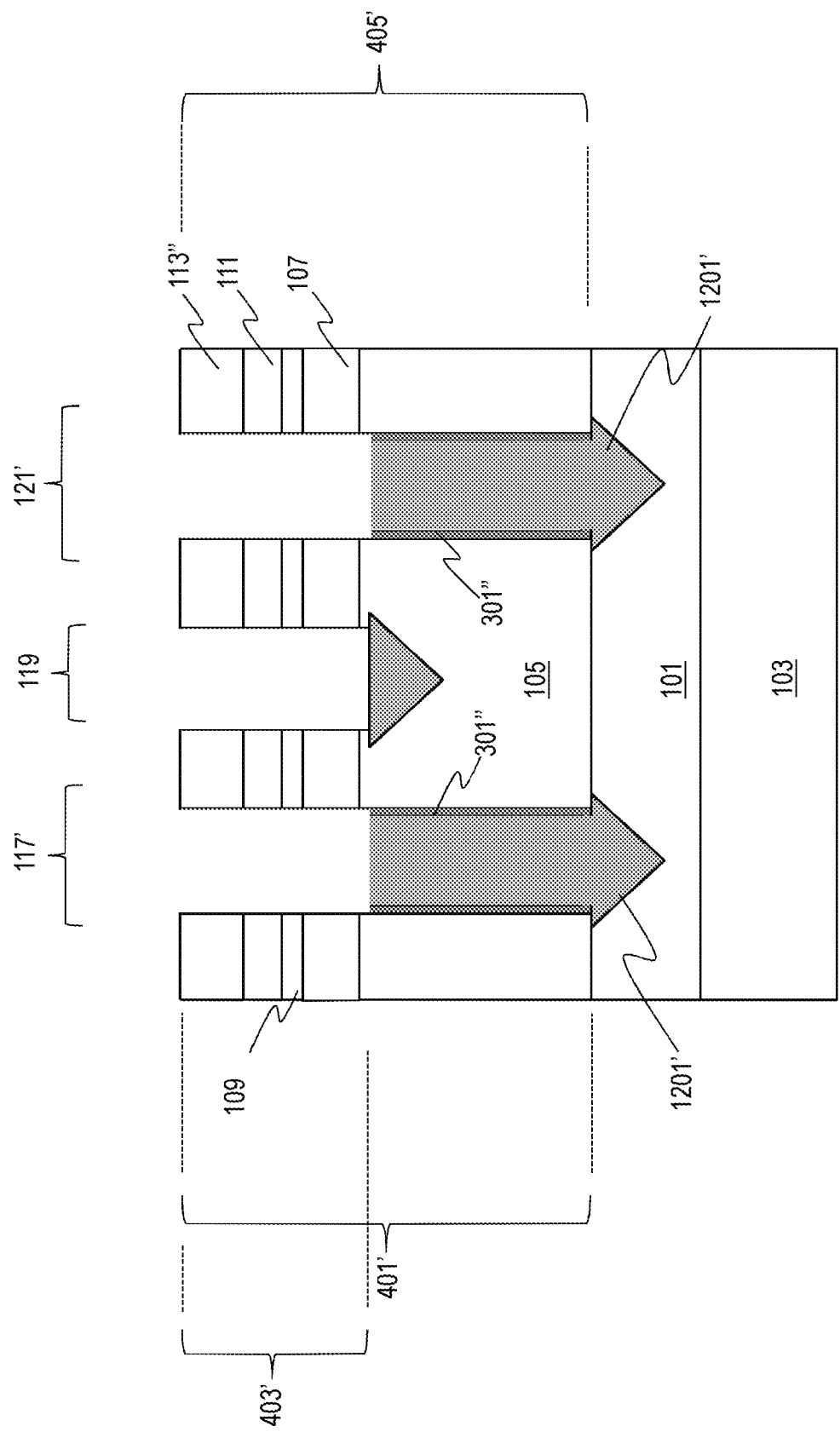

FIGS. 11 through 16 schematically illustrate cross-sectional views of a process flow for forming a bottom region of the multiple depth STI regions having a triangular-shaped sidewall profile, in accordance with an exemplary embodiment. The process steps for FIGS. 11 through 16 are similar to the process steps in FIGS. 5 through 10. Referring to FIG. 11, bottom region 1101 of the STI 117', 119, and 121' are formed, e.g., by a sigma anisotropic wet etching or any other similar etching processes, having a triangular-shaped sidewall profile and a width greater than or equal to the top regions 401, 403 and 405. In this instance, the bottom region 1101 has a depth, e.g., of 5 nm to 100 nm. In another instance, the bottom region 1101 may have any other shapes based on the etching. Thereafter, an oxide layer 1201 is conformally formed, e.g., by FCVD or any other similar deposition processes, over the UDOX layer 115' and the STI 117', 119, and 121', as depicted in FIG. 12. Next, in FIG. 13, the oxide layer 1201 is polished, e.g., by a conventional polishing process. Then, the UDOX layer 115' and portions of the pad nitride layer 113', SiN liner 301' and the oxide layer 1201 are removed, e.g., by an oxide pullback process or any other similar pullback processes, thereby forming pad nitride layer 113", SiN liner 301", oxide layer 1201' and top regions 401', 403' and 405'. In this instance, the upper surface of the SiN liner 301" and the oxide layer 1201' is below the upper surface of the second well 105.

Figure 14:
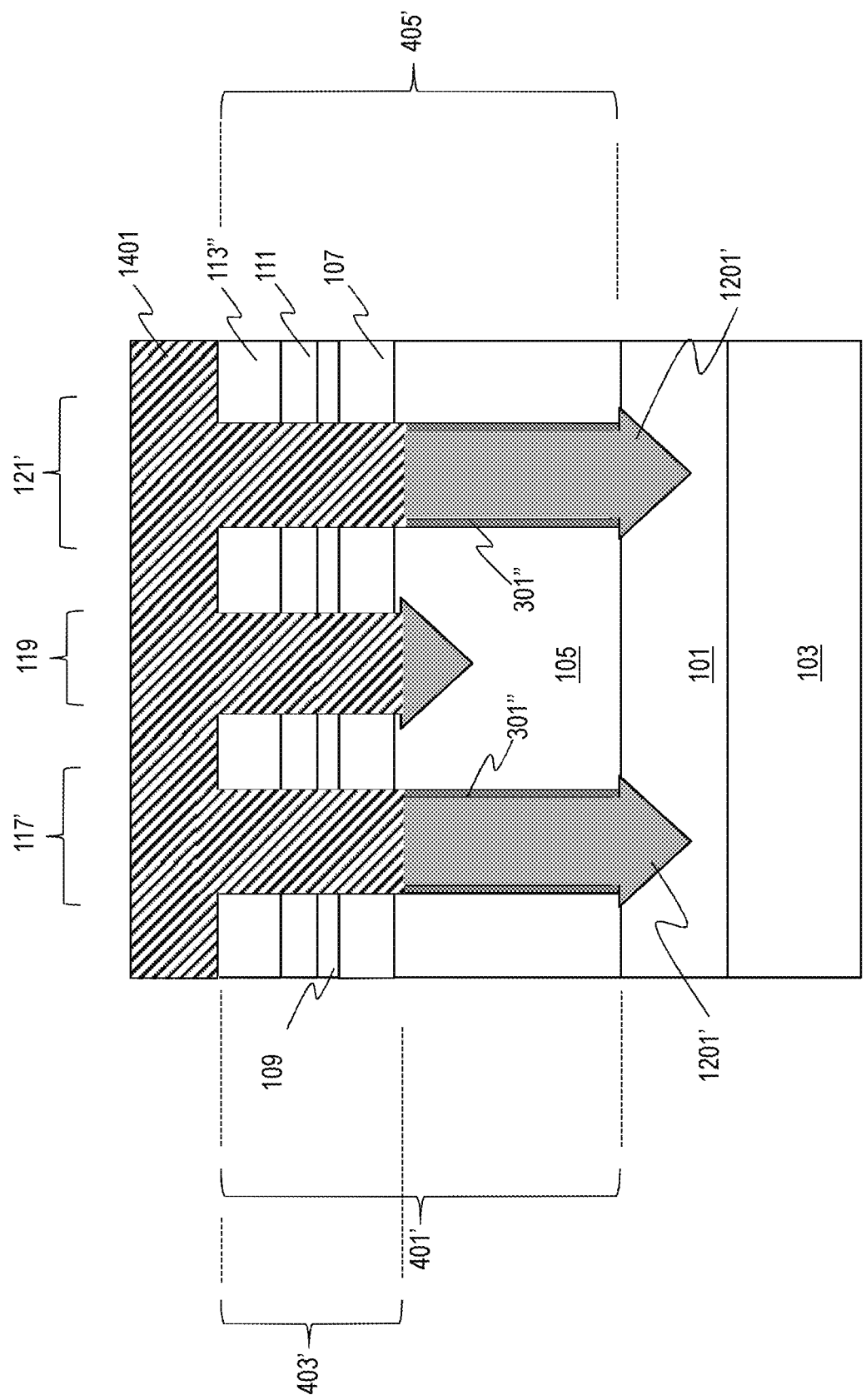
Figure 15:
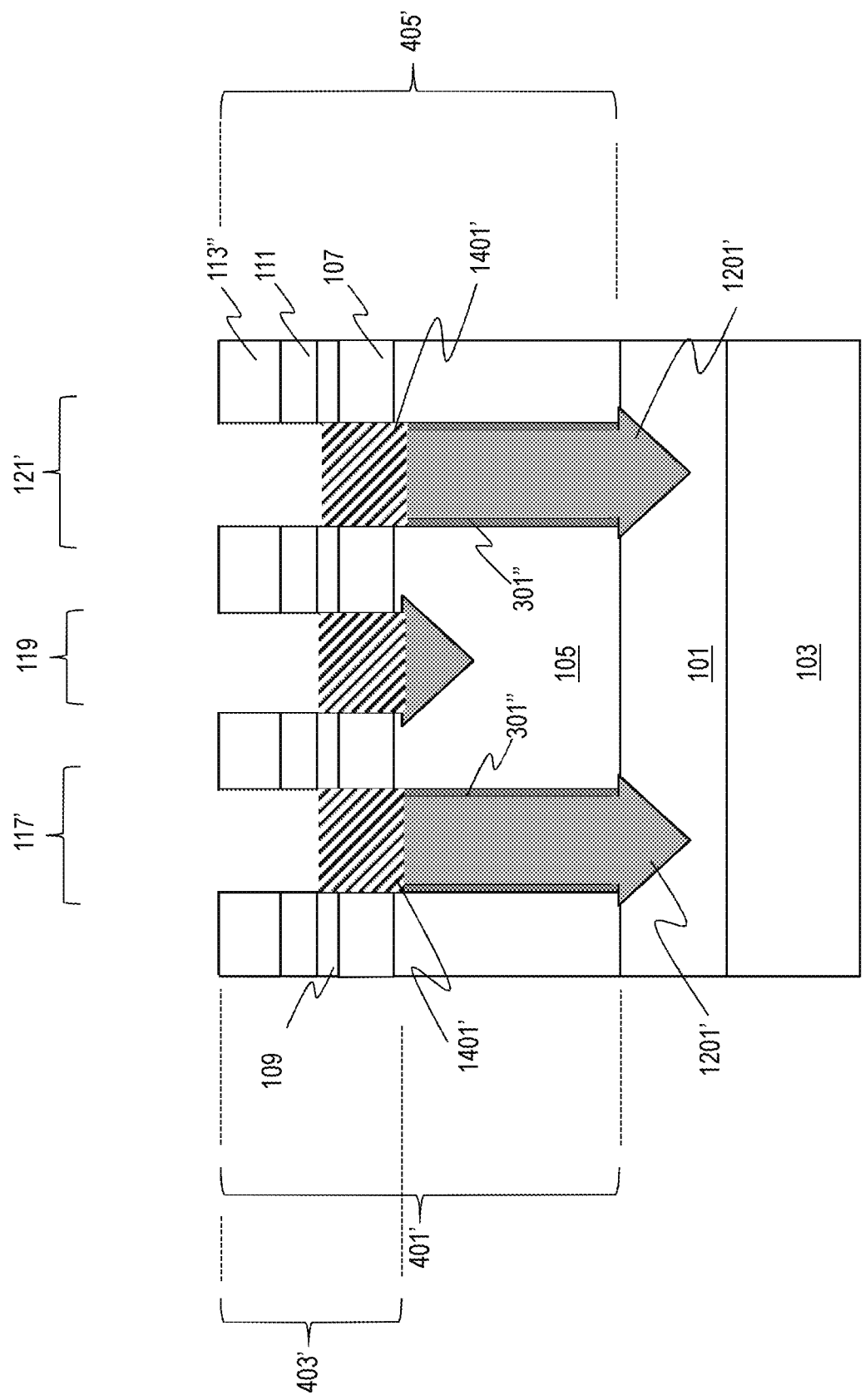
Figure 16:
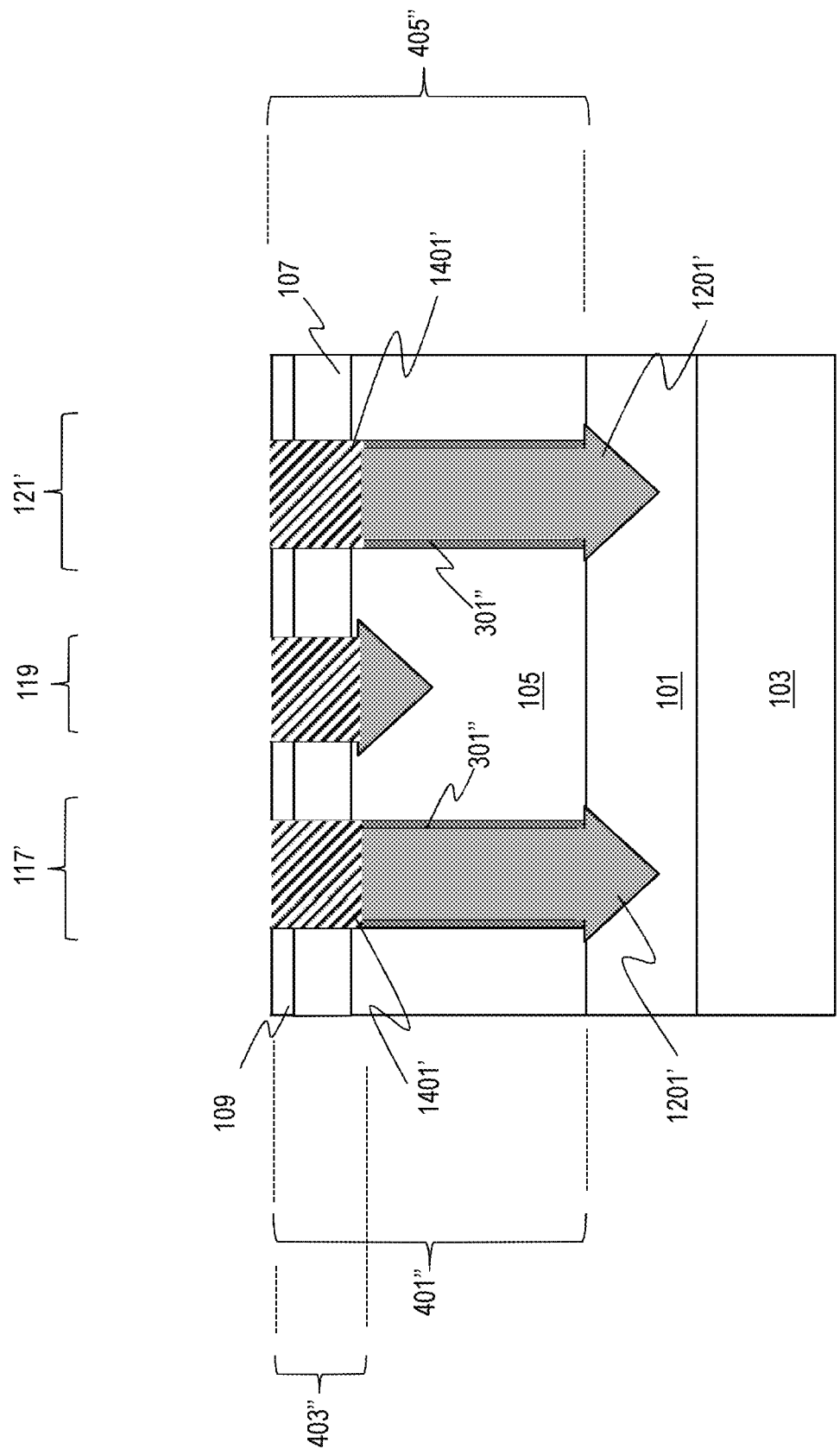

As illustrated in FIG. 14, an HDP or TEOS layer 1401 is conformally formed over the pad nitride layer 113" and the exposed portion of the STI 117', 119 and 121'. Then, the HDP or TEOS layer 1401 is polished, e.g., by a conventional polishing process. Subsequently, a portion of the HDP or TEOS layer 1401 is removed, e.g., by an etch-back process or any other similar etching processes, forming HDP or TEOS layer 1401', as shown in FIG. 15. In this instance, the upper surface of the HDP or TEOS layer 1401' is substantially coplanar to the upper surface of the SOI layer 109. Thereafter, the pad nitride layer 113" and the oxide layer 111 are removed, e.g., by a stripping process, thereby forming top regions 401", 403" and 405", as represented in FIG. 16.

Figure 17:
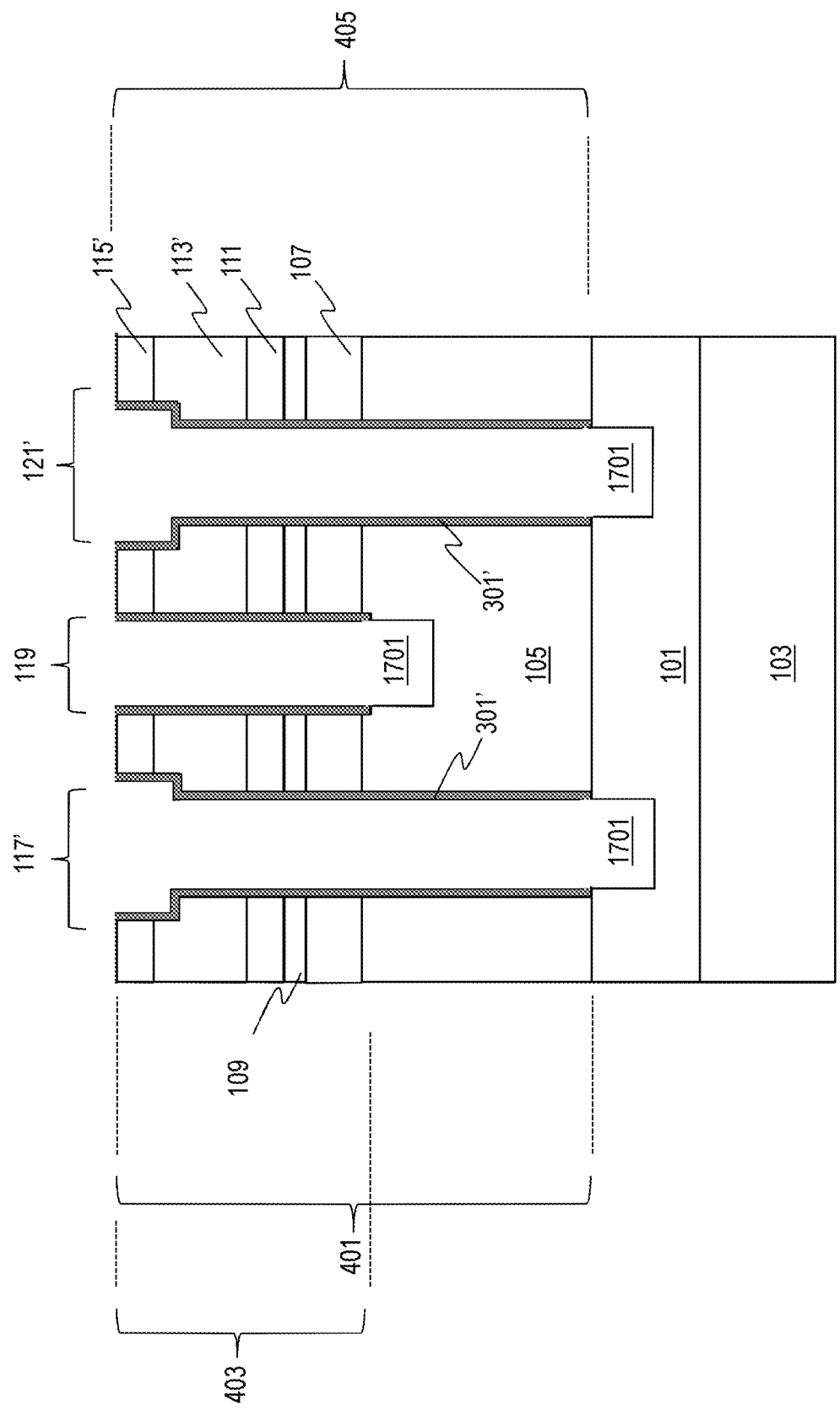
FIGS. 17 through 22 schematically illustrate cross-sectional views of a process flow for forming a bottom region of the multiple depth STI regions having a square-shaped sidewall profile, in accordance with an exemplary embodiment.
Figure 18:
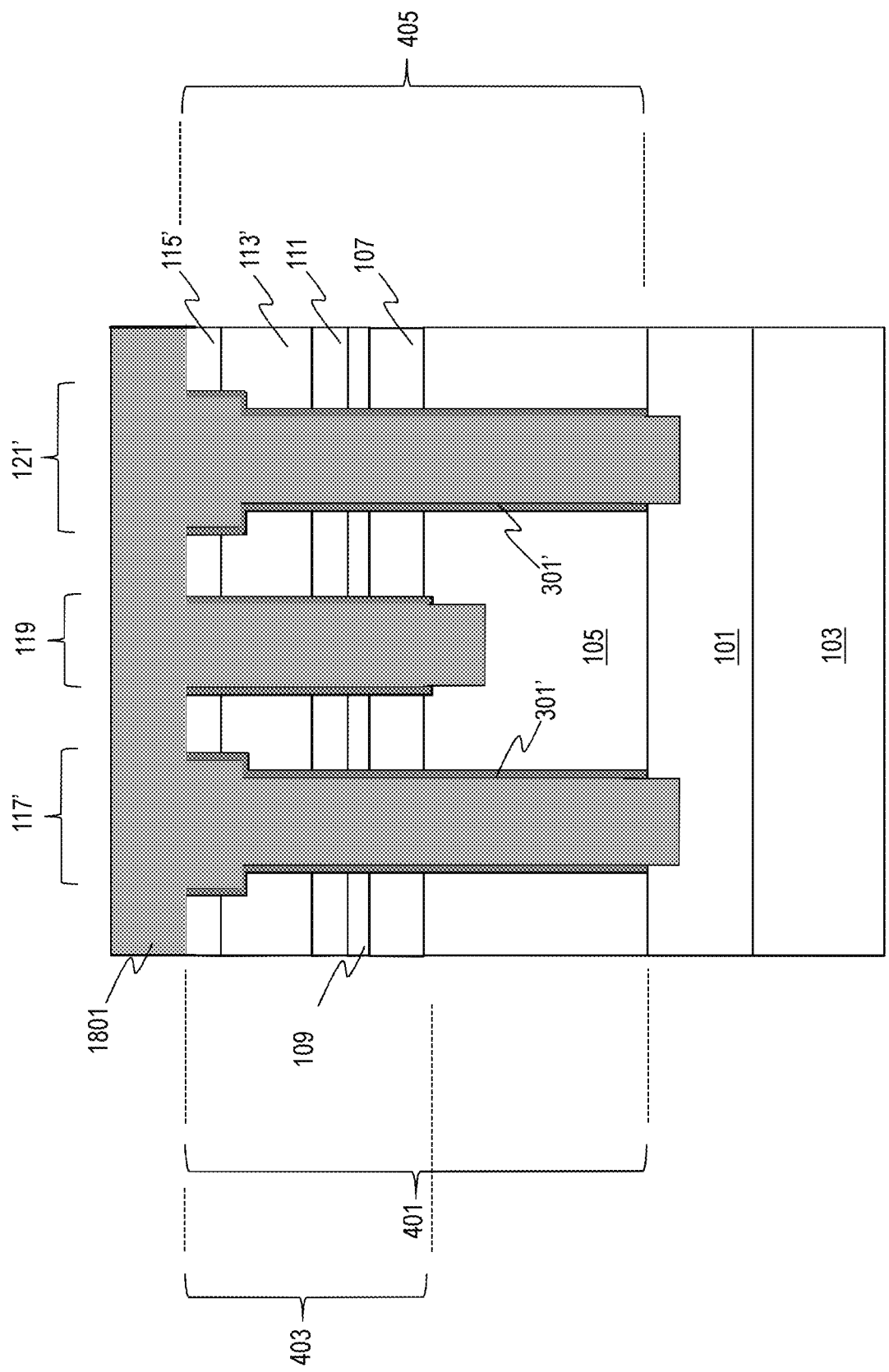
Figure 19:
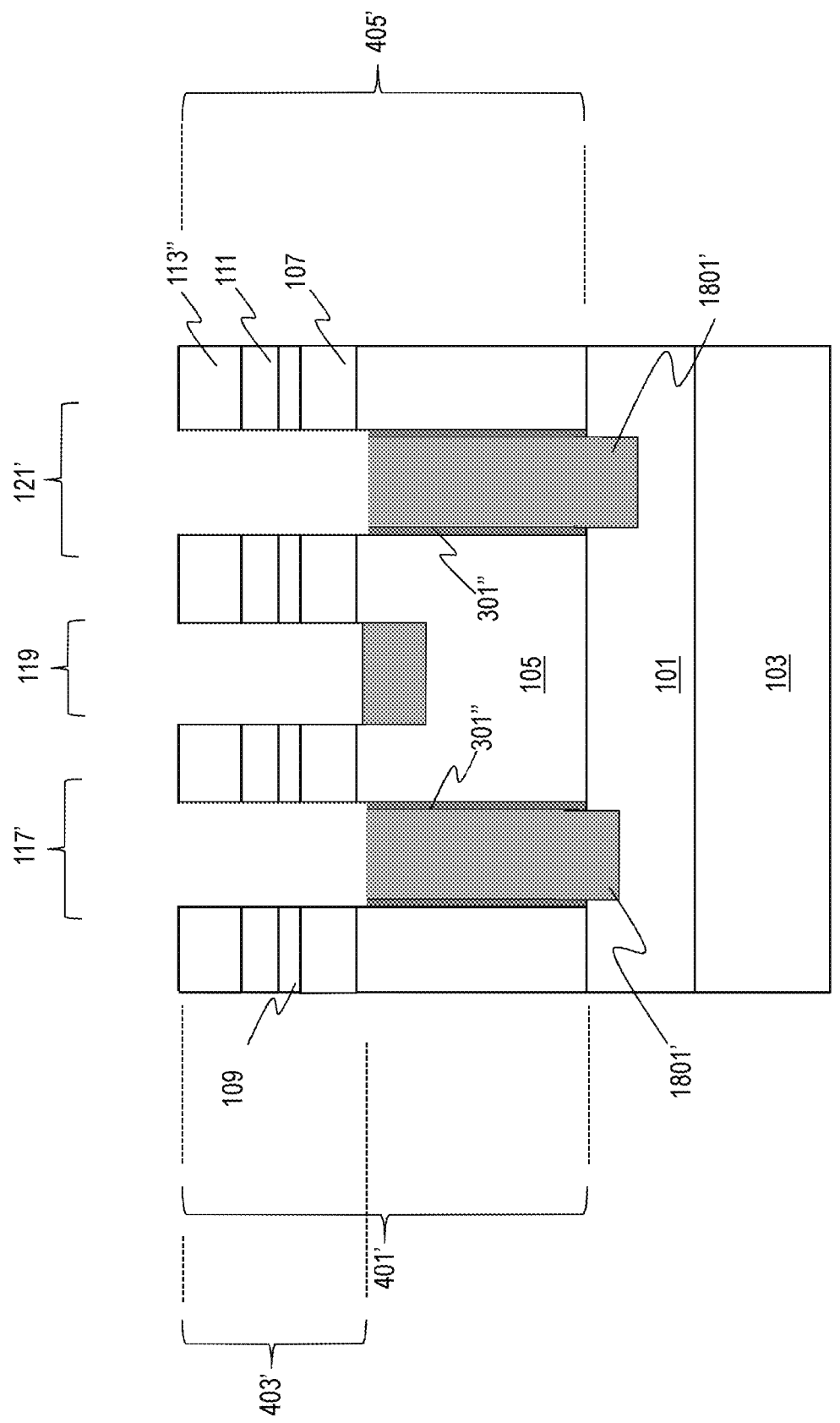

FIGS. 17 through 22 schematically illustrate cross-sectional views of a process flow for forming a bottom region of the multiple depth STI regions having a square-shaped sidewall profile, in accordance with an exemplary embodiment. The process steps for FIGS. 17 through 22 are similar to the process steps in FIGS. 5 through 10 and FIGS. 11 through 16. Referring to FIG. 17, bottom region 1701 of the STI 117', 119, and 121' are formed, e.g., by anisotropic RIE or any other similar etching processes, having a square-shaped sidewall profile and a width greater than or equal to the top regions 401, 403 and 405. In this instance, the bottom region 1701 has a depth, e.g., of 5 nm to 100 nm. In another instance, the bottom region 1701 may have any other shapes based on the etching. Thereafter, an oxide layer 1801 is conformally formed, e.g., by FCVD or any other similar deposition processes, over the UDOX layer 115' and STI 117', 119, and 121', as depicted in FIG. 18. Next, in FIG. 19, the oxide layer 1801 is polished, e.g., by a conventional polishing process. Then, the UDOX layer 115' and portions of the pad nitride layer 113', the SiN liner 301' and the oxide layer 1801 are removed, e.g., by an oxide pullback process or any other similar pullback processes, forming pad nitride layer 113", SiN liner 301", oxide layer 1801' and top regions 401', 403' and 405'. In this instance, the upper surface of the SiN liner 301" and oxide layer 1801' is below the upper surface of the second well 105.

Figure 20:
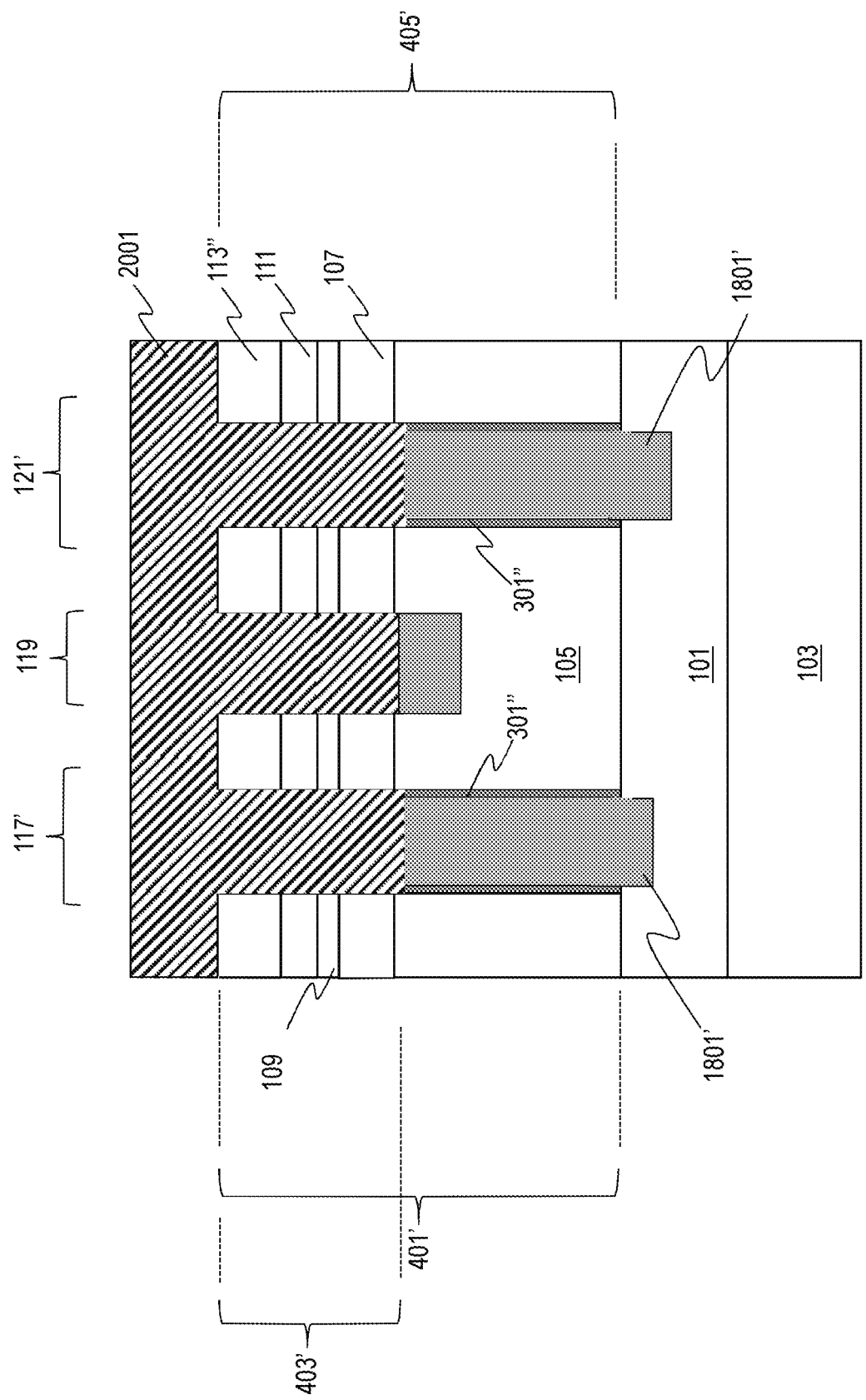
Figure 21:
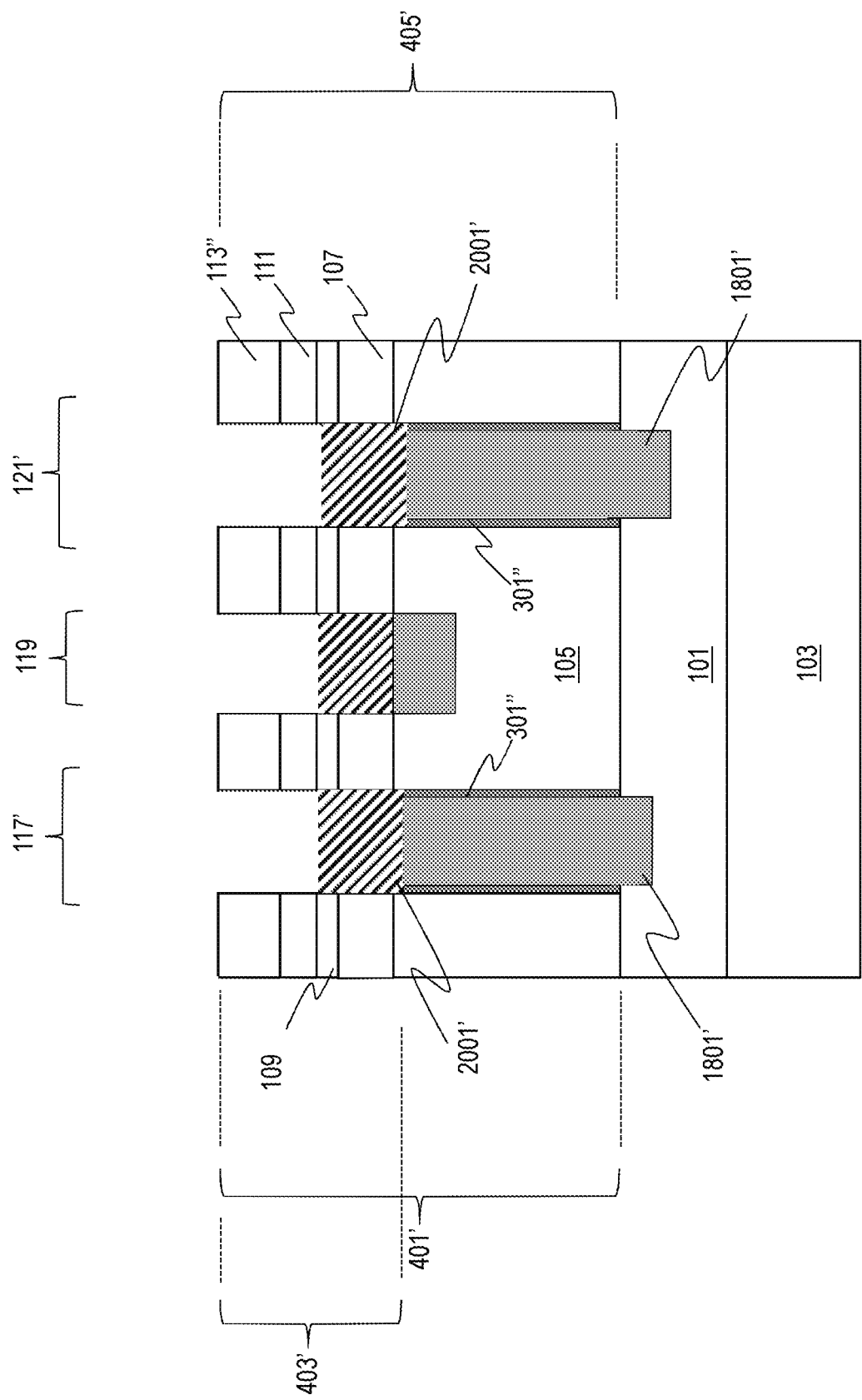
Figure 22:
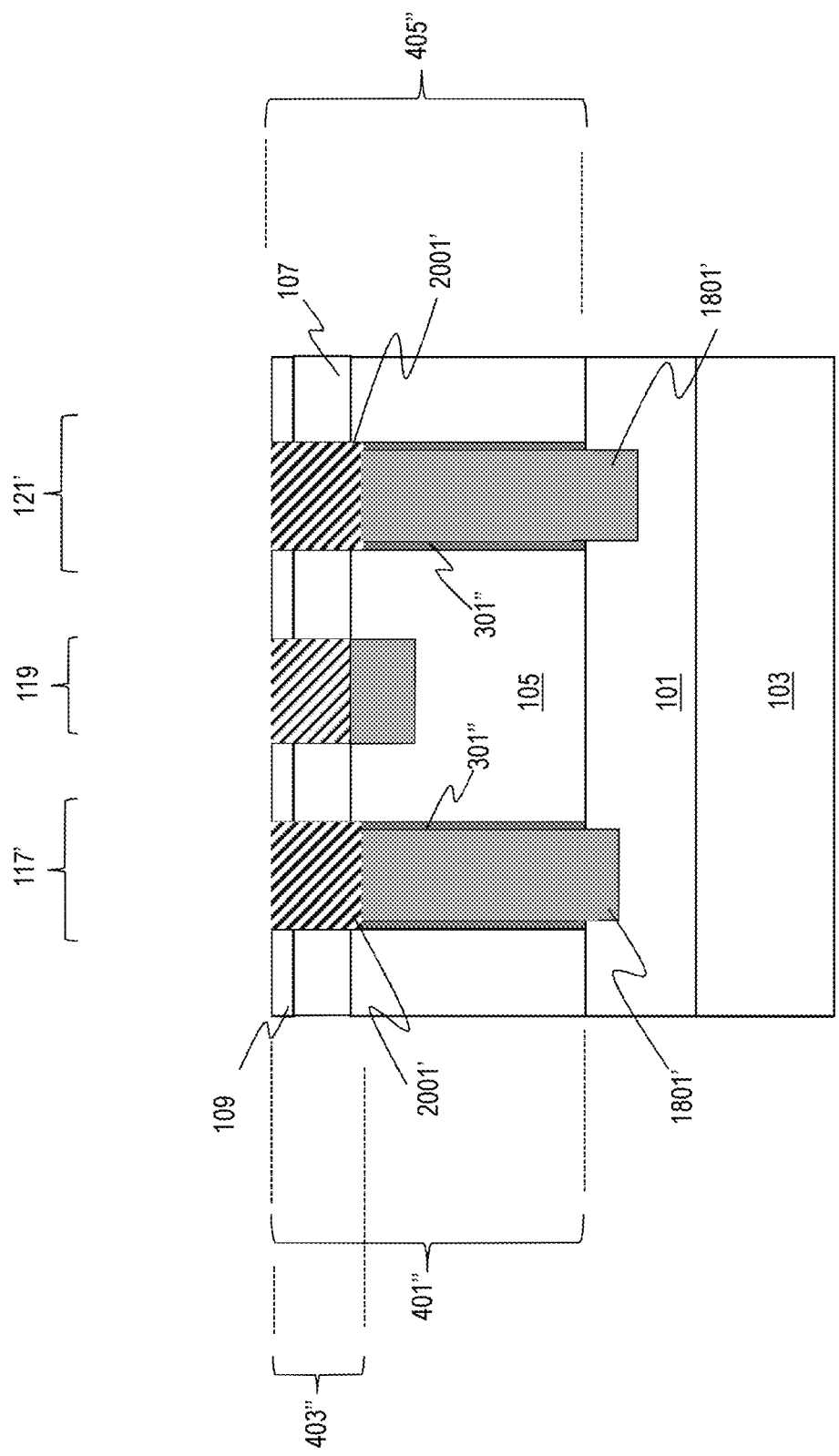

As illustrated in FIG. 20, an HDP or TEOS layer 2001 is conformally formed over the pad nitride layer 113" and the exposed portion of the STI 117', 119 and 121'. Then, the HDP or TEOS layer 2001 is polished, e.g., by a conventional polishing process. Subsequently, a portion of the HDP or TEOS layer 2001 is removed, e.g., by an etch-back process or any other similar processes, forming HDP or TEOS layer 2001', as shown in FIG. 21. In this instance, the upper surface of the HDP or TEOS layer 2001' is substantially coplanar to the upper surface of the SOI layer 109. Thereafter, the pad nitride layer 113" and the oxide layer 111 are removed, e.g., by a stripping process, thereby forming top regions 401", 403" and 405", as represented in FIG. 22.

The embodiments of the present disclosure can achieve several technical effects, such as deeper isolation of STI without compromising front-end-of-line (FEOL) requirements of pad nitride thickness and the limitations of deep fence etching. In addition, cavity etch in the shallow STI eliminates nickel-silicide (NiSi) spike formation due to BOX pullback in shallow STI locations. Devices formed in accordance with embodiments of the present disclosure enjoy utility in various industrial applications, e.g., microprocessors, smartphones, mobile phones, cellular handsets, set-top boxes, DVD recorders and players, automotive navigation, printers and peripherals, networking and telecom equipment, gaming systems, and digital cameras. The present disclosure enjoys industrial applicability in any of highly integrated semiconductor devices, FinFETs or fully depleted silicon on insulator (FDSOI) devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
    a multiple depth shallow trench isolation (STI) regions, wherein each of the multiple depth STI regions comprises: a top region having a vertical sidewall profile; and a bottom region having a width greater than or equal to the top region and a sidewall profile;
    a first well in a portion of a substrate, the first well electrically isolated from the substrate;
    a second well in a portion of the first well, the second well electrically isolated from the first well and the substrate;
    a silicon-on-insulator (SOI) layer over a buried oxide (BOX) layer above the second well; and
    the multiple depth STI regions, laterally separated, through the SOI layer and the BOX layer and in the substrate, wherein at least one of the multiple depth STI regions is deeper than other multiple depth STI regions, wherein the multiple depth STI regions further comprise:
    a first, second and third multiple depth STI regions, wherein the first and third multiple depth STI regions are deeper than the second well;
    a silicon nitride (SiN) liner on sidewall portions of the top region of the first and third multiple depth STI regions;
    an oxide layer in the bottom region and a portion of the top region of the first and third multiple depth STI regions; and
    a high density plasma (HDP) or tetraethyl orthosilicate (TEOS) layer in remaining portion of the top region of the first and third multiple depth STI regions, the upper surface of the HDP or TEOS layer coplanar to the upper surface of the SOI layer.

2. The device according to claim 1, further comprising:
    the bottom region of the second multiple depth STI region in a portion of the second well;
    an oxide layer in the bottom region of the second multiple depth STI region; and
    a HDP or TEOS layer in the top region of the second multiple depth STI region, the upper surface of the HDP or TEOS layer coplanar to the upper surface of the SOI layer.

3. The device according to claim 2, wherein the SOI layer adjacent to the second multiple depth STI region comprises channel silicon germanium (cSiGe).

4. The device according to claim 1, wherein the bottom region of the multiple depth STI regions comprises a circular-shaped sidewall profile, a triangular-shaped sidewall profile or a square-shaped sidewall profile.

5. The device according to claim 1, wherein the top region of the multiple depth STI regions has a width of 10 nanometer (nm) to 200 nm.

6. The device according to claim 1, wherein the SiN liner has a thickness of 2 nanometer (nm) to 10 nm.

7. The device according to claim 1, wherein the bottom region of the multiple depth STI has a depth of 5 nanometer (nm) to 100 nm.

8. A method of forming a multiple depth shallow trench isolation (STI) regions comprising:
    forming a top region having a vertical sidewall profile;
    forming a bottom region having a width greater than or equal to the top region and a sidewall profile;
    forming a first well in a portion of a substrate, wherein the first well is electrically isolated from the substrate;
    forming a second well in a portion of the first well, wherein the second well is electrically isolated from the first well and the substrate;
    forming a stack over the second well; and forming the multiple depth STI regions, laterally separated, through the stack to the substrate, wherein at least one of the multiple depth STI regions is deeper than other multiple depth STI regions, wherein forming the top region of the multiple depth STI regions includes:

forming a first, second and third multiple depth STI regions, laterally separated, through the stack to the second well; and expanding vertically the first and third multiple depth STI regions through the second well to the first well by a deep fence formation process, wherein the deep fence formation process comprises reactive-ion etching (RIE) or dry etching.

9. The method according to claim 8, comprising forming the bottom region of the multiple depth STI regions by:

forming a silicon nitride (SiN) liner over the stack and the top region of the first, second and third multiple depth STI regions;

removing the SiN liner above the stack and on bottom portion of the top region; and removing portions of the first well through the first and third multiple depth STI regions and portions of the second well through the second multiple depth STI region by an isotropic ball wet etching, a sigma anisotropic wet etching or an anisotropic reactive-ion etching (RIE).

10. The method according to claim 9, further comprising:

forming an oxide layer in the bottom region and portions of the top region; and forming a high density plasma (HDP) or tetraethyl orthosilicate (TEOS) layer in remaining portions of the top region.

11. The method according to claim 8, comprising forming the stack by:

providing a silicon-on-insulator (SOI) layer over a buried oxide (BOX) layer above the second well, wherein the SOI layer adjacent to the second multiple depth STI region comprises an epitaxially grown channel silicon germanium (cSiGe);

forming a second oxide layer over the SOI layer;

forming a pad nitride layer over the second oxide layer; and forming an undoped silicon oxide (UDOX) layer over the pad nitride layer.

12. The method according to claim 11, comprising forming the oxide layer further by:

conformally forming the oxide layer over the stack and the top and bottom regions by flowable chemical vapor deposition (FCVD);

polishing the oxide layer; and removing the UDOX layer and portions of the pad nitride layer, the SiN liner and the oxide layer, wherein upper surface of the oxide layer is below upper surface of the second well.

13. The method according to claim 11, comprising forming the HDP or TEOS layer by:

conformally forming the HDP or TEOS layer over the pad nitride layer and the remaining portion of the top region;

polishing the HDP or TEOS layer;

removing portions of the HDP or TEOS layer, wherein upper surface of the HDP or TEOS layer is coplanar to upper surface of the SOI layer; and removing the pad nitride layer and the second oxide layer.

14. A device comprising a multiple depth shallow trench isolation (STI) regions, wherein each of the multiple depth STI regions further comprises:

a first well in a portion of a substrate, the first well electrically isolated from the substrate;

a second well in a portion of the first well, the second well electrically isolated from the first well and the substrate;

a silicon-on-insulator (SOI) layer over a buried oxide (BOX) layer above the second well; and the multiple depth STI regions, laterally separated, through the SOI layer and the BOX layer and in the substrate, wherein the multiple depth STI regions comprises a top region having a vertical sidewall profile and a bottom region having a width greater than or equal to the top region and a sidewall profile, wherein the multiple depth STI regions further comprise:

a first, second and third multiple depth STI regions, wherein the first and third multiple depth STI regions are deeper than the second well.

15. The device according to claim 14, wherein the first and third multiple depth STI regions have a bottom region in the first well and the second multiple depth STI region has a bottom region in the second well, and wherein the bottom region comprises a circular-shaped sidewall profile, a triangular-shaped sidewall profile or a square-shaped sidewall profile.

* * * * *